(12) United States Patent
Kurokawa

(10) Patent No.: US 9,211,625 B2
(45) Date of Patent: Dec. 15, 2015

(54) SAPPHIRE SUBSTRATE FLATTENING METHOD

(71) Applicant: Disco Corporation, Tokyo (JP)

(72) Inventor: Hiroshi Kurokawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/200,280

(22) Filed: Mar. 7, 2014

(65) Prior Publication Data

US 2014/0295645 A1    Oct. 2, 2014

(30) Foreign Application Priority Data

Mar. 27, 2013  (JP) ................................. 2013-066069

(51) Int. Cl.
| | |
|---|---|
| *H01L 21/46* | (2006.01) |
| *B24B 7/22* | (2006.01) |
| *H01L 21/02* | (2006.01) |

(52) U.S. Cl.
CPC ............ *B24B 7/228* (2013.01); *H01L 21/02008* (2013.01)

(58) Field of Classification Search
USPC .............. 438/457, 974; 148/112, 211; 117/94
See application file for complete search history.

(56) References Cited

U.S. PATENT DOCUMENTS

2012/0015799 A1 *   1/2012   Shonai ........................... 501/86

FOREIGN PATENT DOCUMENTS

| JP | 2009-051678 | * | 3/2009 |
| JP | 2011-151099 |   | 8/2011 |
| JP | 2011-249652 | * | 12/2011 |
| RU | 2284073 | * | 9/2006 |

* cited by examiner

*Primary Examiner* — Jack Chen
(74) *Attorney, Agent, or Firm* — Greer Burns & Crain, Ltd.

(57) ABSTRACT

A sapphire substrate flattening method including an ingot slicing step of slicing a sapphire single-crystal ingot to obtain a sapphire substrate, an annealing step of annealing the sapphire substrate, a wafer mounting step of mounting the sapphire substrate processed by the annealing step on a stage having a holding surface in the condition where a first surface of the sapphire substrate is in contact with the holding surface of the stage through a liquid resin, a resin curing step of curing the liquid resin, a first grinding step of grinding a second surface of the sapphire substrate opposite to the first surface, a resin removing step of removing the liquid resin cured on the first surface of the sapphire substrate, and a second grinding step of grinding the first surface of the sapphire substrate.

6 Claims, 10 Drawing Sheets

SAPPHIRE SUBSTRATE FLATTENING METHOD

BACKGROUND OF THE INVENTION

1. Field of the Invention

The present invention relates to a method of flattening a sapphire substrate obtained by slicing an ingot.

2. Description of the Related Art

The surface of a wafer obtained by slicing an ingot with a wire saw has fine undulation (irregularities) and strain. To remove such undulation and strain, both sides of the wafer are ground and polished to be flattened. For example, a wafer flattening method described in Japanese Patent Laid-Open No. 2011-151099 includes the steps of measuring the undulation of a wafer, applying a liquid resin to a film to form a resin layer on the film, attaching one side surface of the wafer to the resin layer, selectively applying ultrasonic waves to the wafer according to the undulation measured above to thereby partially reduce the viscosity of the liquid resin and restore the undulation of the wafer, curing the liquid resin, and grinding the other side surface of the wafer to remove the undulation on the other side surface of the wafer, thus sufficiently removing the undulation on the other side surface of the wafer irrespective of the undulation on one side surface of the wafer.

Further, a wafer flattening method described in Japanese Patent Laid-Open No. 2011-249652 includes the steps of holding one side surface of a wafer on a horizontal holding surface under suction to thereby correct the undulation on one side surface of the wafer and make this surface horizontal, grinding the other side surface of the wafer to remove the strain on the other side surface, holding the other side surface of the wafer on the horizontal holding surface under suction to thereby correct the undulation on the other side surface of the wafer and make this surface horizontal, grinding one side surface of the wafer to remove the strain on one side surface, whereby similar grinding strains are given to one side surface and the other side surface of the wafer, and finally flattening both side surfaces of the wafer, so that a warp or bow due to the strain in the wafer can be effectively removed to achieve high flatness.

SUMMARY OF THE INVENTION

However, a sapphire ingot is hard and a large stress is therefore generated in slicing the sapphire ingot by using a wire saw. Accordingly, a residual stress is left in a sapphire substrate obtained by slicing the sapphire ingot with the wire saw. Conventionally, the surface of the sapphire substrate is flattened without consideration of the residual stress left in the sapphire substrate. As a result, a warp or bow is generated due to the residual stress left in the sapphire substrate, causing a problem that high flatness cannot be achieved.

It is therefore an object of the present invention to provide a sapphire substrate flattening method which can suppress the generation of a warp or bow due to the residual stress left in a sapphire substrate sliced from a sapphire ingot, thereby achieving high flatness.

In accordance with an aspect of the present invention, there is provided a sapphire substrate flattening method including an ingot slicing step of slicing a sapphire single-crystal ingot to obtain a sapphire substrate; an annealing step of annealing said sapphire substrate obtained by said ingot slicing step; a wafer mounting step of mounting said sapphire substrate processed by said annealing step on a stage having a holding surface in the condition where a first surface of said sapphire substrate is in contact with said holding surface of said stage through a liquid resin; a resin curing step of curing said liquid resin after performing said wafer mounting step; a first grinding step of grinding a second surface of said sapphire substrate opposite to said first surface after performing said resin curing step; a resin removing step of removing said liquid resin cured on said first surface of said sapphire substrate after performing said first grinding step; and a second grinding step of grinding said first surface of said sapphire substrate after performing said resin removing step.

In the sapphire substrate flattening method according to the present invention, the sapphire substrate obtained by slicing the sapphire single-crystal ingot is annealed to thereby remove the residual stress left in the sapphire substrate. Thereafter, both side (first and second surfaces) of the sapphire substrate is subjected to flattening. Accordingly, the generation of a warp or bow due to the residual stress can be suppressed to thereby ensure high flatness.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
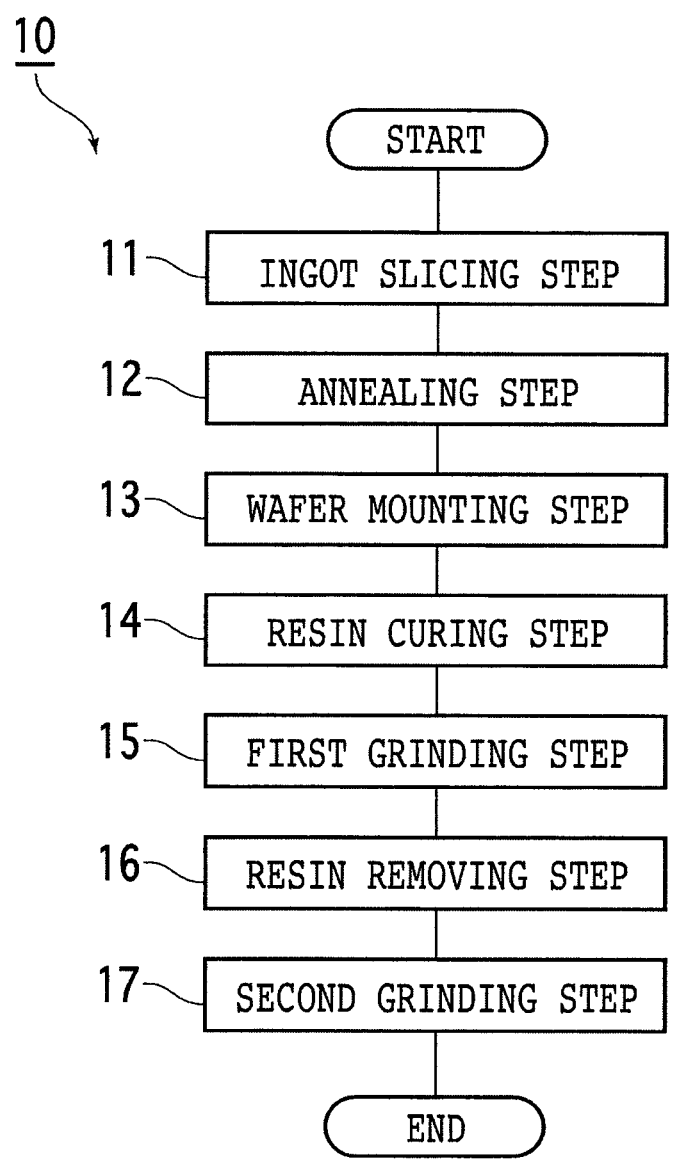
FIG. 1 is a flowchart showing the sapphire substrate flattening method according to the present invention.

Referring to FIG. 1, there is shown a flow 10 of the sapphire substrate flattening method according to the present invention. The flow 10 has the following procedure. An ingot slicing step 11 is first performed to slice a sapphire single-crystal ingot into sapphire substrates by using a wire saw. An annealing step 12 is next performed to anneal the sapphire substrates obtained by the ingot slicing step 11. A wafer mounting step 13 is next performed to mount each sapphire substrate processed by the annealing step 12 on a stage having a holding surface in the condition where one side surface (first surface) of this sapphire substrate is in contact with the holding surface of the stage through a liquid resin. A resin curing step 14 is next performed to cure the liquid resin adhering to the sapphire substrate processed by the wafer mounting step 13. A first grinding step 15 is next performed to grind the other side surface (second surface) of the sapphire substrate processed by the resin curing step 14. A resin removing step 16 is next performed to remove the liquid resin cured on the first surface of the sapphire substrate processed by the first grinding step 15. A second grinding step 17 is next performed to grind the first surface of the sapphire substrate processed by the resin removing step 16. These steps will now be individually described.

(1) Ingot Slicing Step

Figure 2:
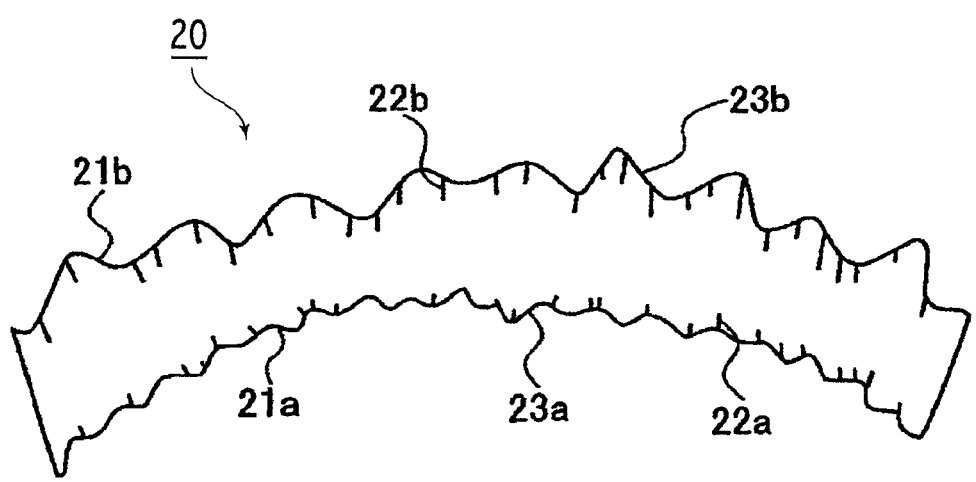
FIG. 2 is a schematic view showing a sapphire substrate obtained by performing an ingot slicing step.

Referring to FIG. 2, there is shown a sapphire substrate 20 obtained by slicing a sapphire single-crystal ingot with a wire saw. The sapphire substrate 20 has a first surface 21a and a second surface 21b. The first surface 21a has a processing strain 22a and an undulation 23a. Similarly, the second surface 21b has a processing strain 22b and an undulation 23b. Further, a warp or bow is generated in the sapphire substrate 20 due to the processing strains 22a and 22b and internal residual stress (not shown). In FIG. 2, the sapphire substrate 20 is enlarged in the direction along the thickness thereof to emphasize the surface irregularities of the sapphire substrate 20. The same also applies to FIGS. 4 to 6 and FIGS. 8 to 10 to be hereinafter referred to.

(2) Annealing Step

Figure 3:
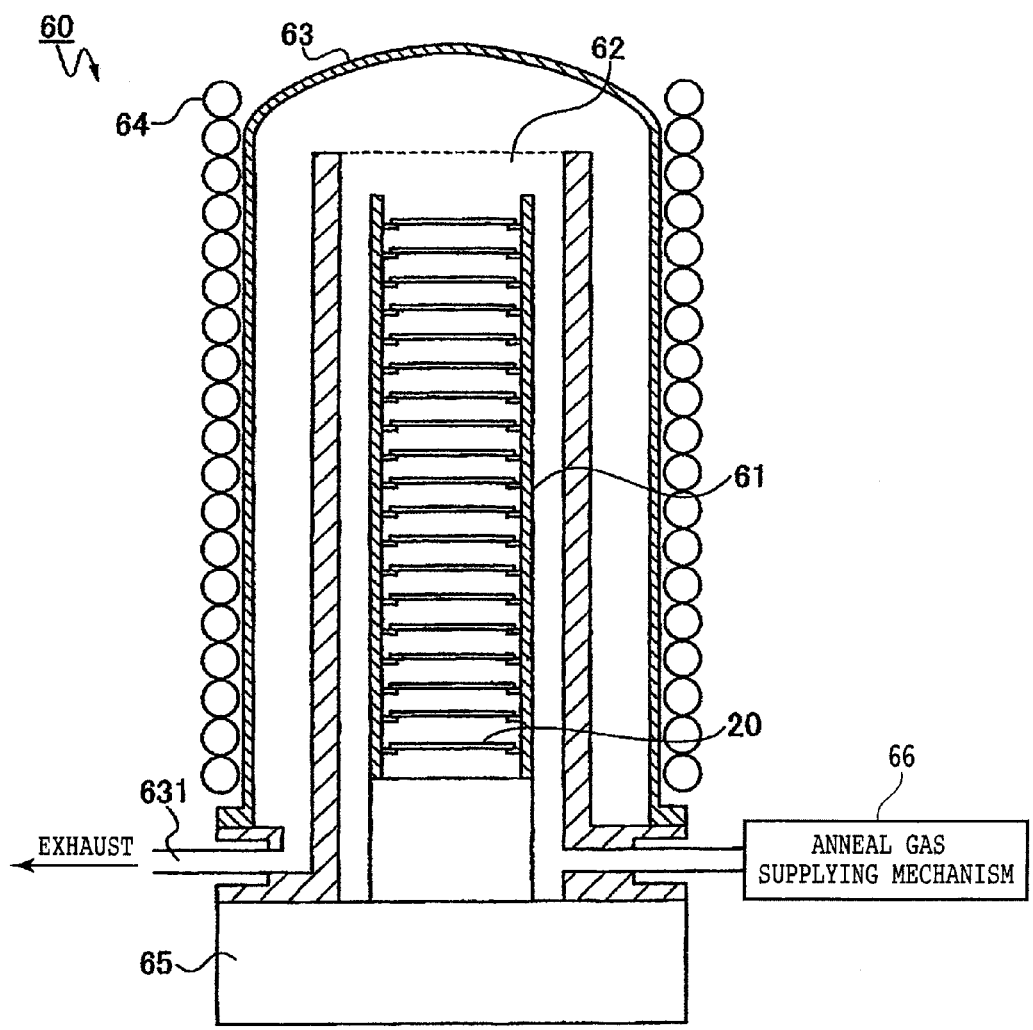
FIG. 3 is a sectional view showing an annealing apparatus.

Referring to FIG. 3, there is shown an annealing apparatus 60 for performing the annealing step. The annealing apparatus 60 includes a wafer rack 61 for placing the sapphire substrates 20 obtained by the ingot slicing step, an inner tube 62 for surrounding the wafer rack 61, an outer tube 63 connected to the inner tube 62 for surrounding the inner tube 62, a heater 64 provided outside the outer tube 63, a wafer rack elevating mechanism 65 for loading and unloading the wafer rack 61 into and from the inner tube 62, and an anneal gas supplying mechanism 66 for supplying an anneal gas into the inner tube 62.

Examples of the anneal gas include air and a mixed gas of 20% oxygen and 80% argon. The anneal gas supplied into the inner tube 62 by the anneal gas supplying mechanism 66 is agitated toward the plural sapphire substrates 20 stored in the wafer rack 61 and next guided through the outer tube 63 to a gas outlet 631 formed through the wall of the outer tube 63 from which gas outlet 631 the anneal gas is exhausted. The outer tube 63 functions to prevent that any substance contaminating the sapphire substrates 20 may enter the inner tube 62 from the heater 64. Further, any contaminant not completely blocked by the outer tube 63, but entered the outer tube 63 is discharged together with the anneal gas.

In performing the annealing step 12, the sapphire substrates 20 are placed in the wafer rack 61, and the wafer rack elevating mechanism 65 is then operated to insert the wafer rack 61 into the inner tube 62. Thereafter, the anneal gas supplying mechanism 66 is operated to supply the anneal gas into the inner tube 62. Thereafter, the heater 64 is operated to heat the sapphire substrates 20 placed in the wafer rack 61, thereby annealing the sapphire substrates 20 at a predetermined temperature for a predetermined time. By annealing the sapphire substrates 20 in this manner, the residual stress in each sapphire substrate 20 is removed. Further, the processing strains 22a and 22b on the surfaces of each sapphire substrate 20 are also removed to some extent by this annealing. The annealing temperature is preferably set to 900 to 1650° C., for example, which is suitable for sapphire. In an experiment, the residual stress in each sapphire substrate could be removed by performing the annealing at 1400° C. for four hours or at 1250° C. for four hours.

Figure 4:
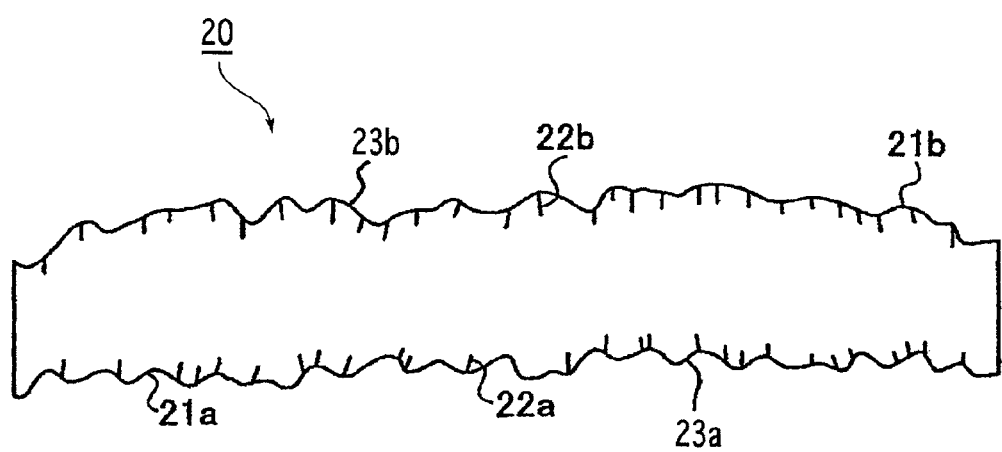
FIG. 4 is a schematic view showing the sapphire substrate processed by an annealing step.

As shown in FIG. 4, the warp or bow of the sapphire substrate 20 processed by the annealing step is reduced because the residual stress in the sapphire substrate 20 has been removed and the processing strains 22a and 22b have also been removed to some extent.

(3) Wafer Mounting Step

Figure 5:
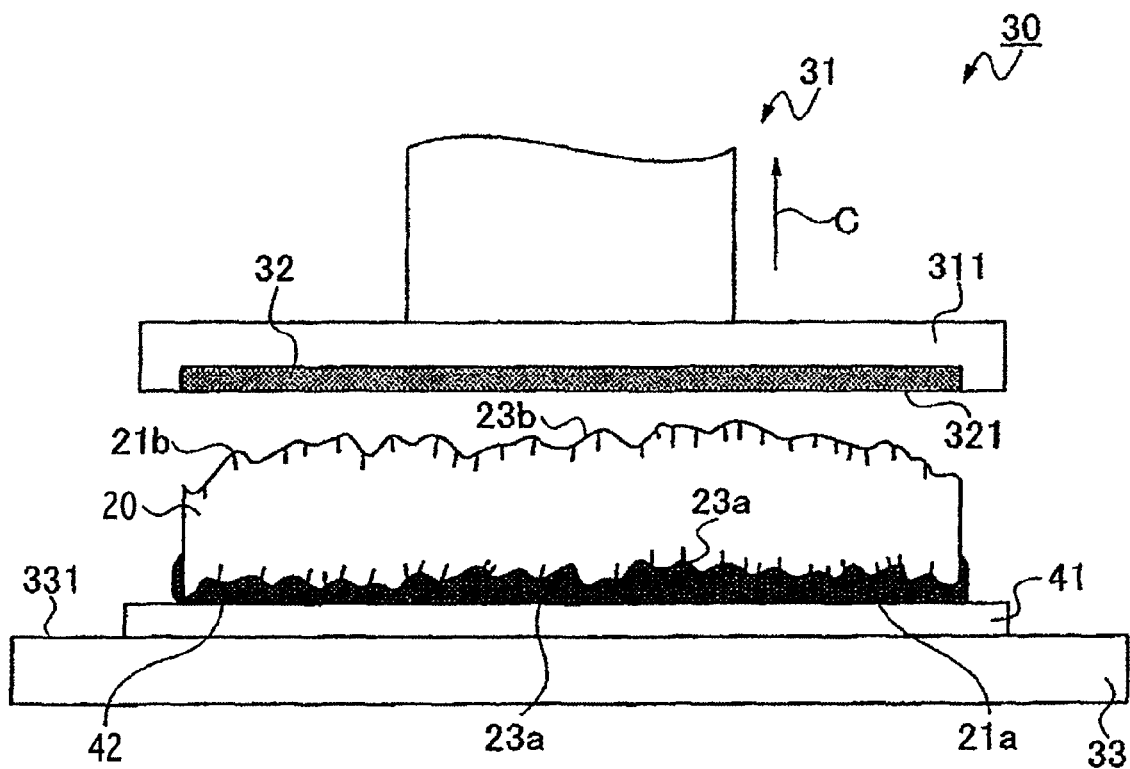
FIG. 5 is a schematic view showing a wafer mounting step.

Referring to FIG. 5, there is shown a resin coating apparatus 30 for performing the wafer mounting step. The resin coating apparatus 30 includes a stage 33 having a horizontal holding surface 331. The stage 33 is formed of a material capable of transmitting ultraviolet radiation. The resin coating apparatus 30 further includes holding means 31 having a pressure pad 311. A holding member 32 having a suction holding surface 321 is provided on the lower surface of the pressure pad 311. The sapphire substrate 20 is held under suction on the suction holding surface 321 of the holding member 32. A film 41 is placed on the holding surface 331 of the stage 33, and an ultraviolet curable resin 42 (liquid resin) in the form of a liquid is dropped onto this film 41. Thereafter, the sapphire substrate 20 held under suction by the holding means 31 is placed on the ultraviolet curable resin 42 dropped onto the film 41 placed on the holding surface 331 of the stage 33. Thereafter, the pressure pad 311 is operated to apply a uniform pressure to the whole surface of the sapphire substrate 20, thereby spreading the ultraviolet curable resin 42. As a result, the first surface 21a of the sapphire substrate 20 is entirely coated with the ultraviolet curable resin 42. Thereafter, the suction from the suction holding surface 321 is stopped to release the sapphire substrate 20 from the holding means 31. Thereafter, the holding means 31 is retracted upward as shown by an arrow C in FIG. 5.

(4) Resin Curing Step

Figure 6:
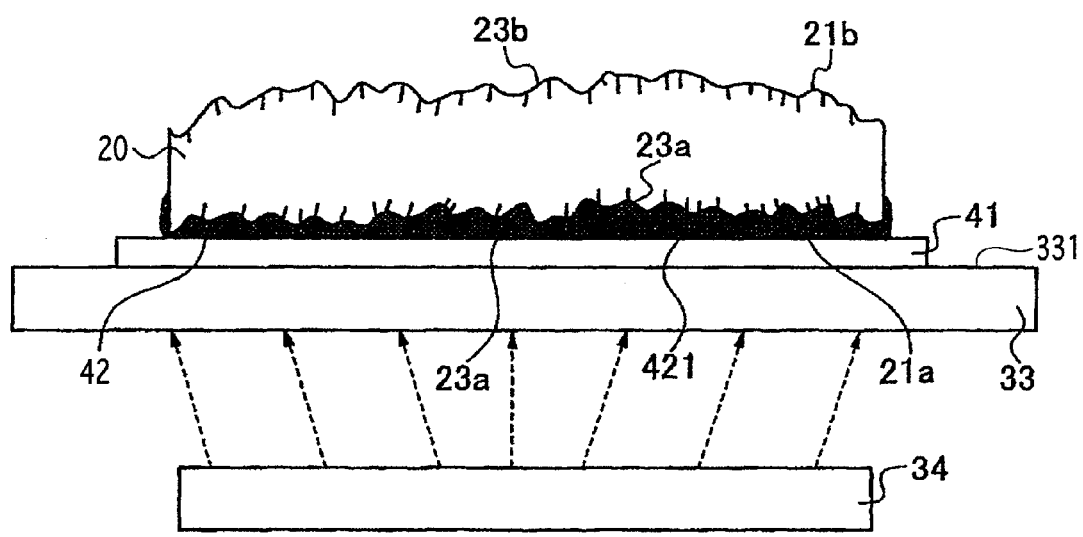
FIG. 6 is a schematic view showing a resin curing step.

As shown in FIG. 6, ultraviolet radiation is applied from a UV lamp 34 through the stage 33 and the film 41 to the ultraviolet curable resin 42 covering the first surface 21a (lower surface) of the sapphire substrate 20, thereby curing the ultraviolet curable resin 42. The UV lamp 34 is located below the stage 33. Accordingly, the lower surface of the ultraviolet curable resin 42 cured above is formed as a flat surface 421 with reference to the horizontal holding surface 331 of the stage 33.

(5) First Grinding Step

Figure 7:
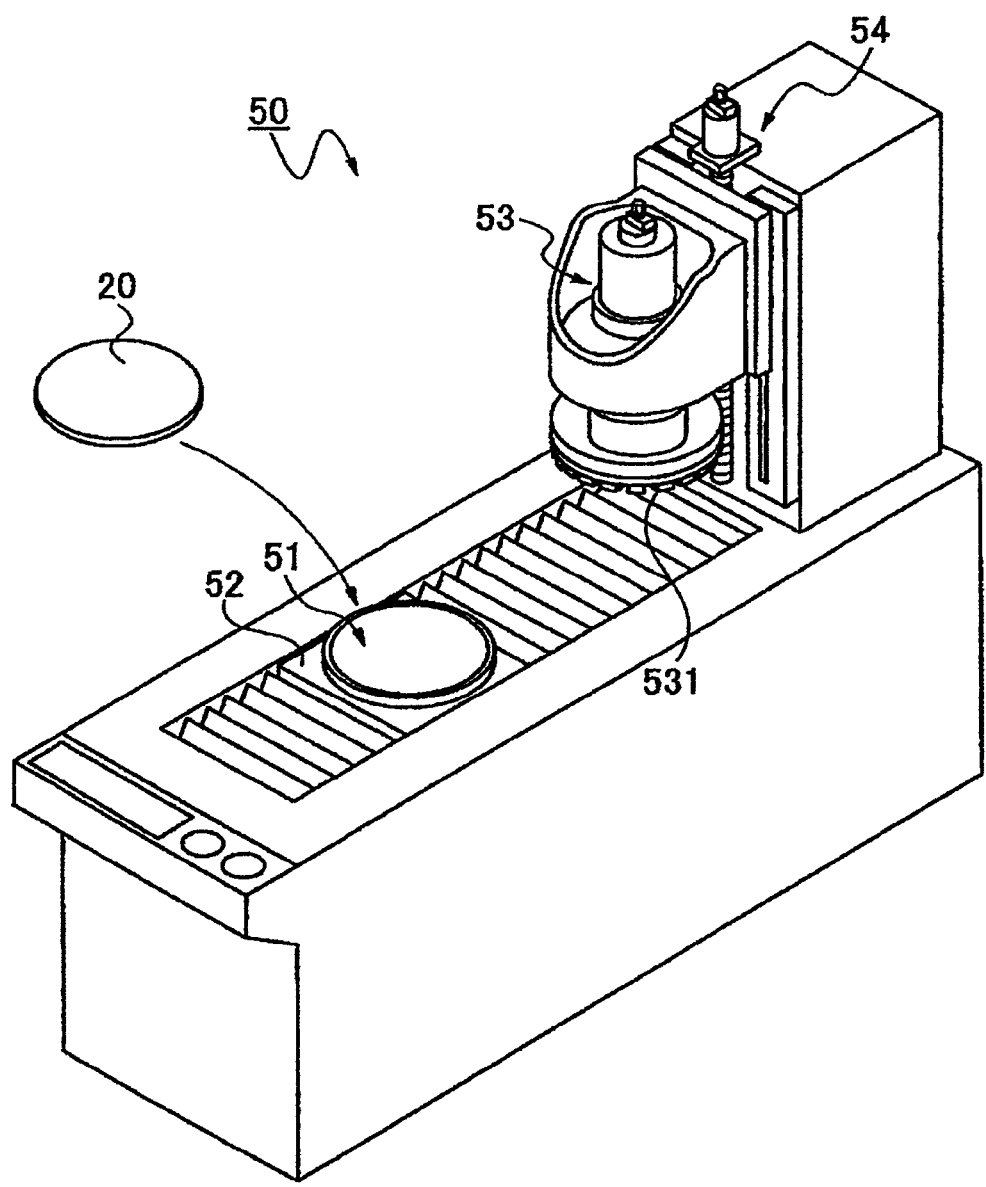
FIG. 7 is a perspective view showing a grinding apparatus.

Referring to FIG. 7, there is shown a grinding apparatus 50 for performing the first grinding step. The grinding apparatus 50 includes a chuck table 51 for holding the sapphire substrate 20, a table support 52 for rotatably supporting the chuck table 51, a grinding unit 53 for grinding the upper surface (second surface 21b) of the sapphire substrate 20 held on the chuck table 51, and feeding means 54 for vertically moving the grinding unit 53. The grinding unit 53 includes a plurality of abrasive members 531 annularly arranged and rotatably mounted.

Figure 8:
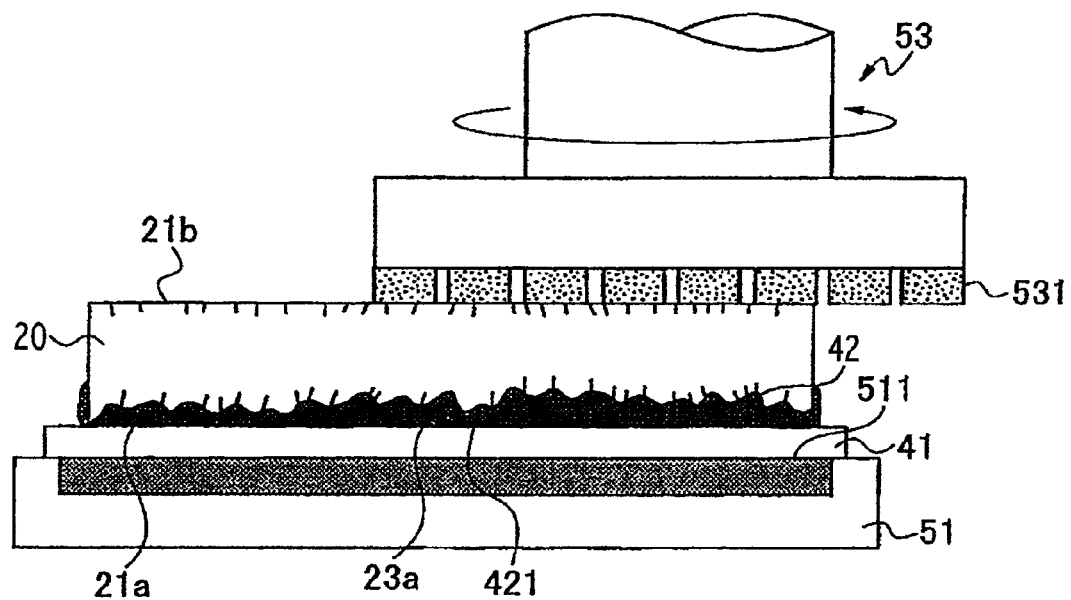
FIG. 8 is a schematic view showing a first grinding step.

As shown in FIG. 8, the sapphire substrate 20 bonded through the ultraviolet curable resin 42 to the film 41 is held on a holding surface 51 (upper surface) of the chuck table 51 in the condition where the second surface 21b not coated with the ultraviolet curable resin 42 is oriented upward, i.e., the flat surface 421 is oriented downward. Thereafter, the feeding means 54 is operated to lower the grinding unit 53, and the abrasive members 531 of the grinding unit 53 is rotated and pressed on the second surface 21b of the sapphire substrate 20, thereby grinding the second surface 21b. Since the flat surface 421 of the ultraviolet curable resin 42 is held on the holding surface 511 of the chuck table 51 through the film 41, the second surface 21b of the sapphire substrate 20 held on the chuck table 51 can be ground flat without being influenced by the undulation 23a of the first surface 21a of the sapphire substrate 20.

(6) Resin Removing Step

Figure 9:
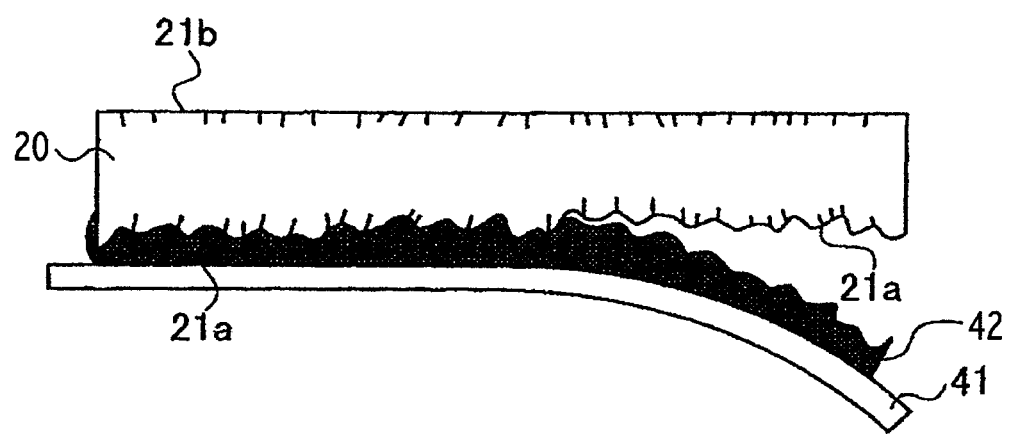
FIG. 9 is a schematic view showing a resin removing step.

As shown in FIG. 9, the film 41 is peeled from the sapphire substrate 20 processed by the first grinding step. At this time, the ultraviolet curable resin 42 cured is also peeled from the sapphire substrate 20 together with the film 41. As a result, the first surface 21a of the sapphire substrate 20 is exposed.

(7) Second Grinding Step

Figure 10:
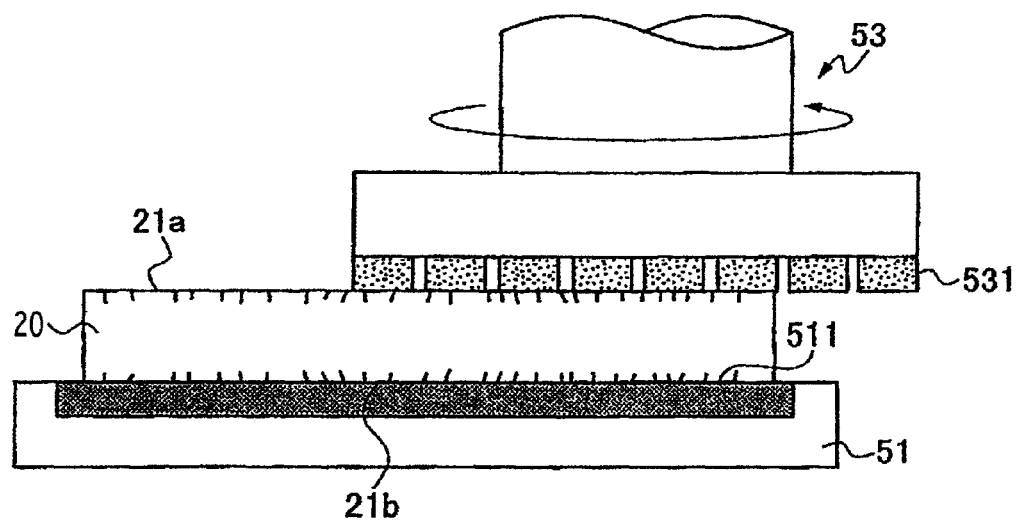
FIG. 10 is a schematic view showing a second grinding step.

The sapphire substrate 20 processed by the resin removing step shown in FIG. 9 is turned upside down to make a condition that the first surface 21a not ground is oriented upward, i.e., the second surface 21b ground to be flattened is oriented downward. The second grinding step of grinding the first surface 21a of the sapphire substrate 20 is also performed by using the grinding apparatus 50 shown in FIG. 7. That is, the sapphire substrate 20 processed by the resin removing step is held on the holding surface 511 of the chuck table 51 in the condition where the first surface 21a of the sapphire substrate 20 is oriented upward as shown in FIG. 10. Thereafter, the abrasive members 531 of the grinding unit 53 are rotated and pressed on the first surface 21a of the sapphire substrate 20, thereby grinding the first surface 21a. The second surface 21b of the sapphire substrate 20 has already been ground flat by the first grinding step mentioned above, so that the undulation 23a of the first surface 21a is not influenced by the holding of the second surface 21b on the chuck table 51, but the first surface 21a can be ground flat.

As described above, each sapphire substrate obtained by slicing the sapphire single-crystal ingot is annealed to thereby remove the residual stress left in the sapphire substrate. As a result, the warp or bow of the sapphire substrate can be removed. Thereafter, both sides (first and second surfaces) of the sapphire substrate are subjected to flattening. Accordingly, the influence of the warp or bow of the sapphire substrate can be eliminated in flattening the surfaces of the sapphire substrate, thereby ensuring high flatness. Accordingly, it is possible to obtain a substrate surface having ultraflat terrace surfaces with the same crystal orientation and linear regular step edges, which is suitable for an insulating substrate in a semiconductor device.

As similar to the primary grinding step described in Japanese Patent Laid-Open No. 2011-249652, double-side grinding may be performed to the sapphire substrate 20 processed by the annealing step 12. In this case, the processing strains 22a and 22b on both sides of the sapphire substrate 20 can be removed to thereby ensure higher flatness. As a modification, both sides of the sapphire substrate 20 obtained by the ingot slicing step 11 may be ground by the primary grinding step described in Japanese Patent Laid-Open No. 2011-249652. Thereafter, this sapphire substrate 20 may be annealed by the annealing step 12. In this case, a grinding strain generated in the primary grinding step can be removed by the annealing.

As another modification, the undulation measuring step and the undulation restoring step described in Japanese Patent Laid-Open Nos. 2011-151099 and 2011-249652 may be performed to the sapphire substrate 20 processed by the annealing step 12 (or the sapphire substrate processed by the primary grinding step), wherein the undulation 23b of the second surface 21b of the sapphire substrate 20 is measured and the undulation 23b of the second surface 21b of the sapphire substrate 20 placed on the stage 33 is restored. Thereafter, the ultraviolet curable resin 42 is cured in the resin curing step 14. In this case, even when the sapphire substrate 20 is pressed on the ultraviolet curable resin 42 in the condition where the undulation 23b of the second surface 21b is corrected, the undulation 23b can be restored, so that higher flatness can be ensured.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A sapphire substrate flattening method comprising:
an ingot slicing step of slicing a sapphire single-crystal ingot to obtain a sapphire substrate;
an annealing step of annealing said sapphire substrate obtained by said ingot slicing step, wherein said annealing step is performed by accommodating said sapphire substrate in an annealing chamber, heating said annealing chamber and supplying an annealing gas to said annealing chamber;
a wafer mounting step of mounting said sapphire substrate processed by said annealing step on a stage having a holding surface in a condition where a first surface of said sapphire substrate is in contact with said holding surface of said stage through a liquid resin;
a resin curing step of curing said liquid resin after performing said wafer mounting step;
a first grinding step of grinding a second surface of said sapphire substrate opposite to said first surface after performing said resin curing step;
a resin removing step of removing said liquid resin cured on said first surface of said sapphire substrate after performing said first grinding step; and
a second grinding step of grinding said first surface of said sapphire substrate after performing said resin removing step.

2. The method according to claim 1, wherein said annealing step is performed within an annealing apparatus comprised of a rack for supporting said sapphire substrate, an inner tube surrounding said rack and an outer tube surrounding said inner tube, and further wherein during said annealing step, the annealing gas is supplied to said inner tube and is guided from said inner tube to said outer tube and is then exhausted via a gas outlet formed in said outer tube.

3. The method according to claim 1, wherein said annealing gas comprises oxygen and argon.

4. The method according to claim 3, wherein said annealing gas comprises 20% oxygen and 80% argon.

5. The method according to claim 2, wherein said annealing apparatus includes a heater positioned outside of said outer tube, whereby said outer tube prevents at least some substances from the heater from entering said inner tube.

6. The method according to claim 5, wherein substances not blocked by said outer tube are discharged together with said annealing gas through said gas outlet.

* * * * *